United States Patent
Bringoltz et al.

(10) Patent No.: US 9,869,543 B2
(45) Date of Patent: Jan. 16, 2018

(54) REDUCING ALGORITHMIC INACCURACY IN SCATTEROMETRY OVERLAY METROLOGY

(71) Applicant: KLA-Tencor Corporation, Milpitas, CA (US)

(72) Inventors: Barak Bringoltz, Rishon le Tzion (IL); Mark Ghinovker, Yoqneam Ilit (IL); Daniel Kandel, Aseret (IL); Vladimir Levinski, Migdal Haemek (IL); Zeev Bomzon, Kiryat Tivon (IL)

(73) Assignee: KLA-Tencor Corporation, Milpitas, CA (US)

( * ) Notice: Subject to any disclaimer, the term of this patent is extended or adjusted under 35 U.S.C. 154(b) by 536 days.

(21) Appl. No.: 14/184,295

(22) Filed: Feb. 19, 2014

(65) Prior Publication Data
US 2015/0233705 A1  Aug. 20, 2015

(51) Int. Cl.
G01B 11/14 (2006.01)
G01B 11/24 (2006.01)

(52) U.S. Cl.
CPC .......... *G01B 11/14* (2013.01); *G01B 11/2441* (2013.01)

(58) Field of Classification Search
CPC . G01B 11/14; G01B 11/2441; G01B 11/2531; G01B 11/2536; G01B 11/00; G03F 7/70633
See application file for complete search history.

(56) References Cited

U.S. PATENT DOCUMENTS 7,656,529 B1 * 2/2010 Nikoonahad ....... G03F 7/70633
                                                   356/400
2003/0223066 A1   12/2003 Lee et al.
2007/0229829 A1   10/2007 Kandel et al.
2007/0279630 A1   12/2007 Kandel et al.
2008/0049226 A1    2/2008 Mieher et al.
2009/0279091 A1   11/2009 Levinski et al.

OTHER PUBLICATIONS

Kandel et al., Overlay Accuracy Fundamentals, 2012, Proc. of SPIE, vol. 8324, 10 pp.*
Ku et al., Accuracy of Diffraction-Based Overlay Metrology Using a Single Array Target, Dec. 2009, Optical Engineering, vol. 48(12), 7 pp.*
Kandel et al., Differential Signal Scatterometry Overlay Metrology: An Accuracy Investigation, 2007, Proc. of SPIE, vol. 6616, Optical Measurement Systems for Industrial Inspection V, 11 pp.*
Leray et al., Diffraction Based Overlay Metrology: Accuracy and Performance on Front End Stack, 2008, Proc. of SPIE, vol. 6922, 12 pp.*

* cited by examiner

*Primary Examiner* — Toan Le
(74) *Attorney, Agent, or Firm* — Suiter Swantz pc llo

(57) ABSTRACT

Methods and systems for minimizing of algorithmic inaccuracy in scatterometry overlay (SCOL) metrology are provided. SCOL targets are designed to limit the number of oscillation frequencies in a functional dependency of a resulting SCOL signal on the offset and to reduce the effect of higher mode oscillation frequencies. The targets are segmented in a way that prevents constructive interference of high modes with significant amplitudes, and thus avoids the inaccuracy introduced by such terms into the SCOL signal. Computational methods remove residual errors in a semi-empirical iterative process of compensating for the residual errors algorithmically or through changes in target design.

25 Claims, 9 Drawing Sheets

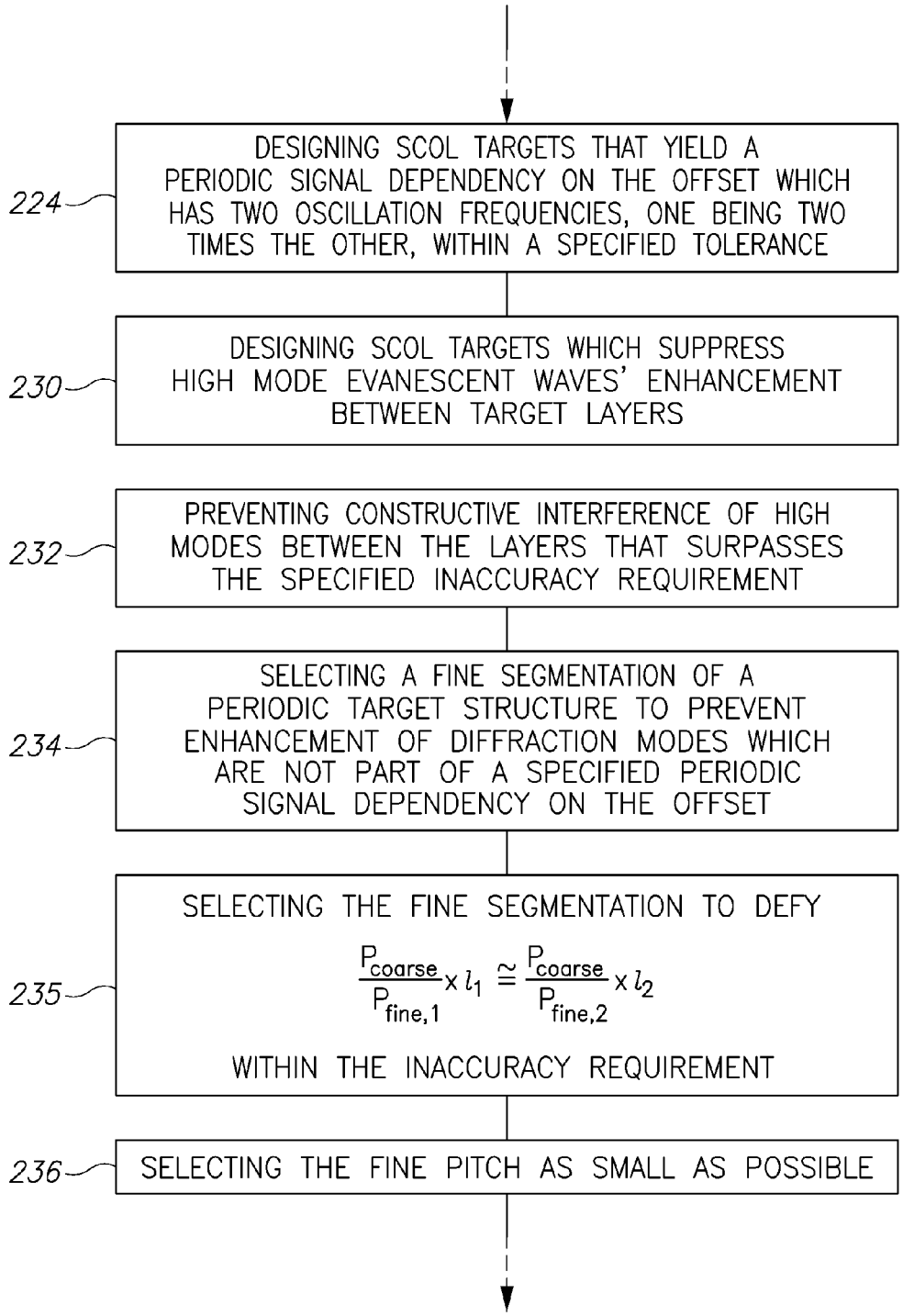
Figure 4 (cont. 1)

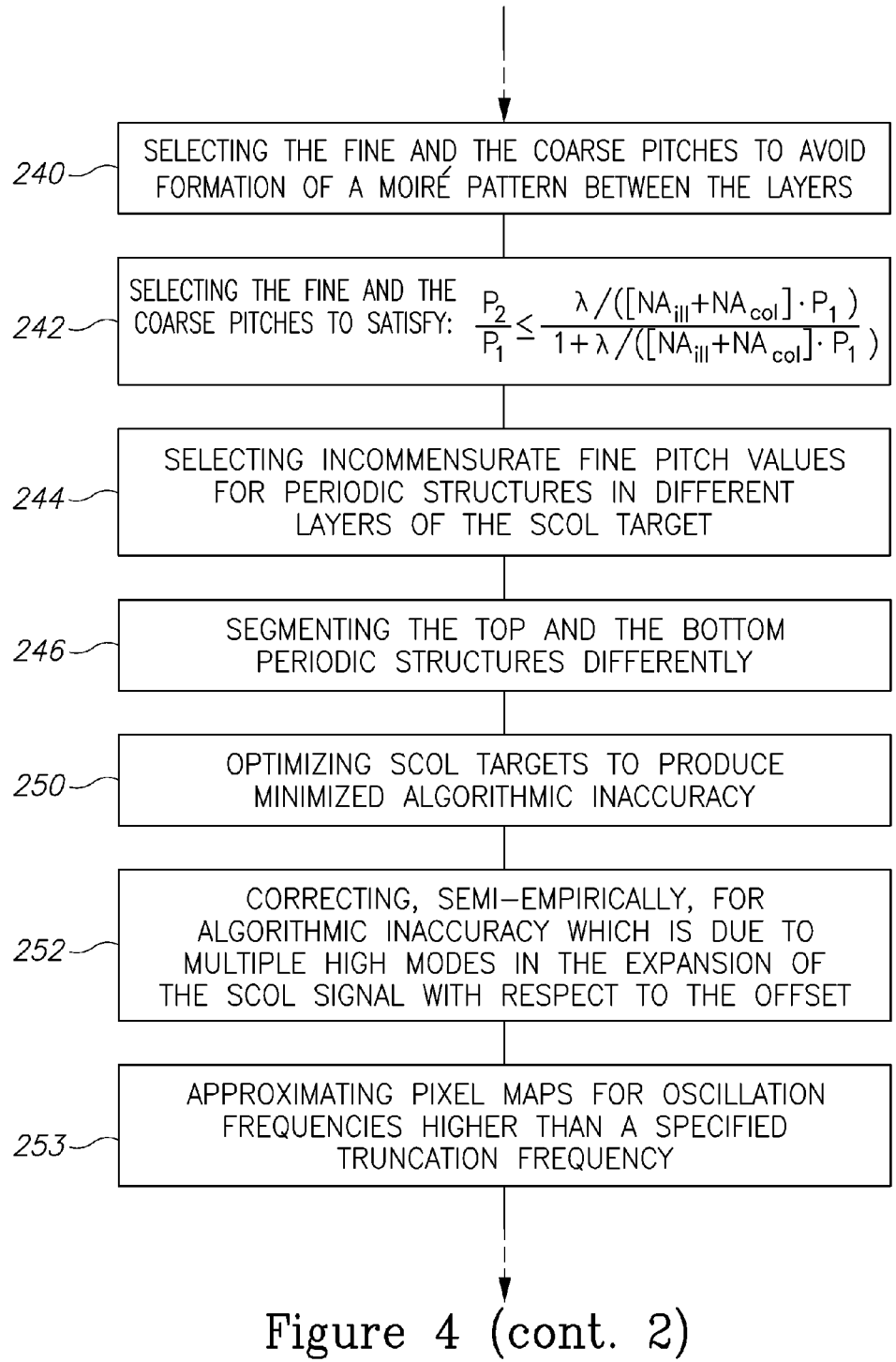
Figure 4 (cont. 2)

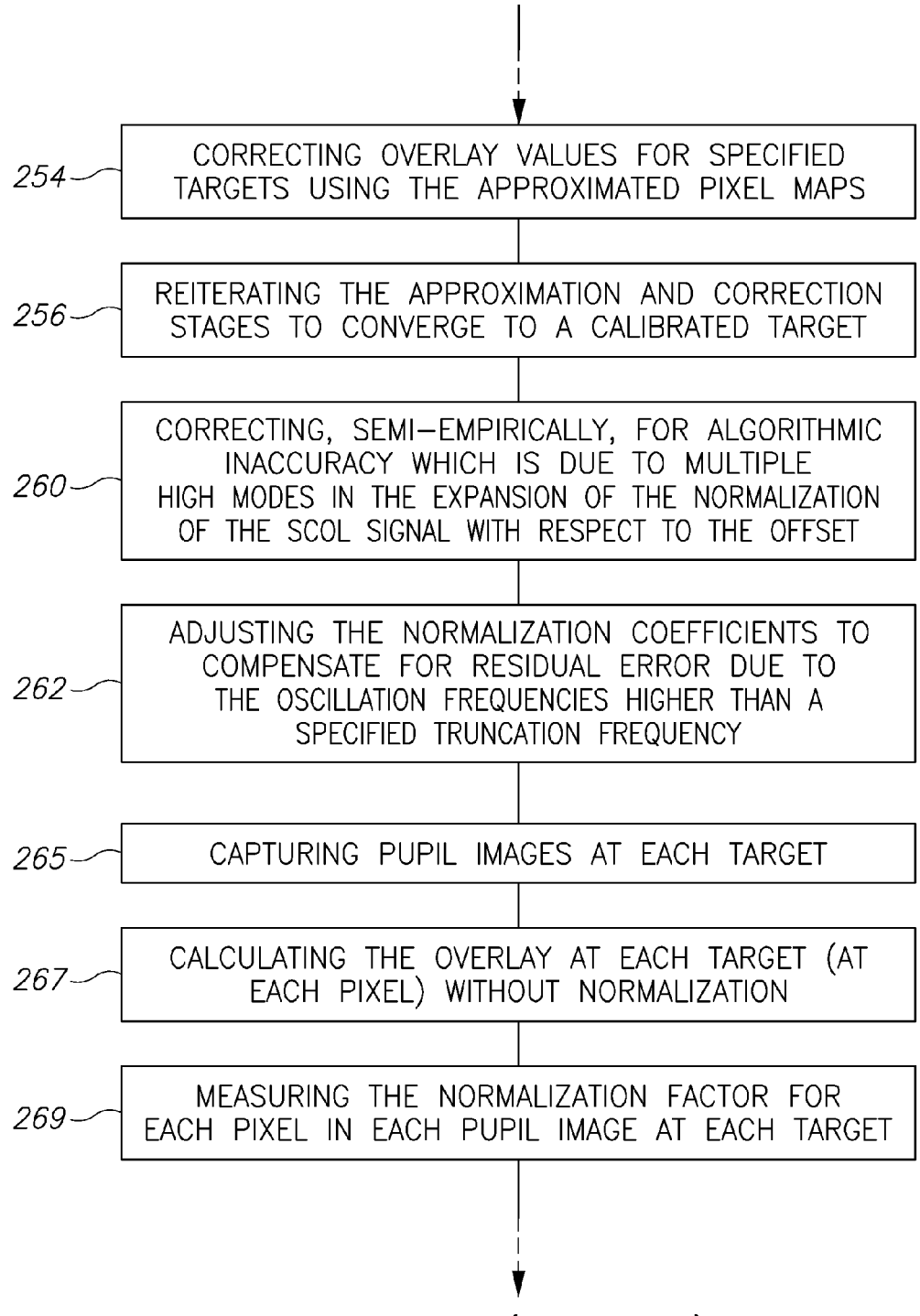
Figure 4 (cont. 3)

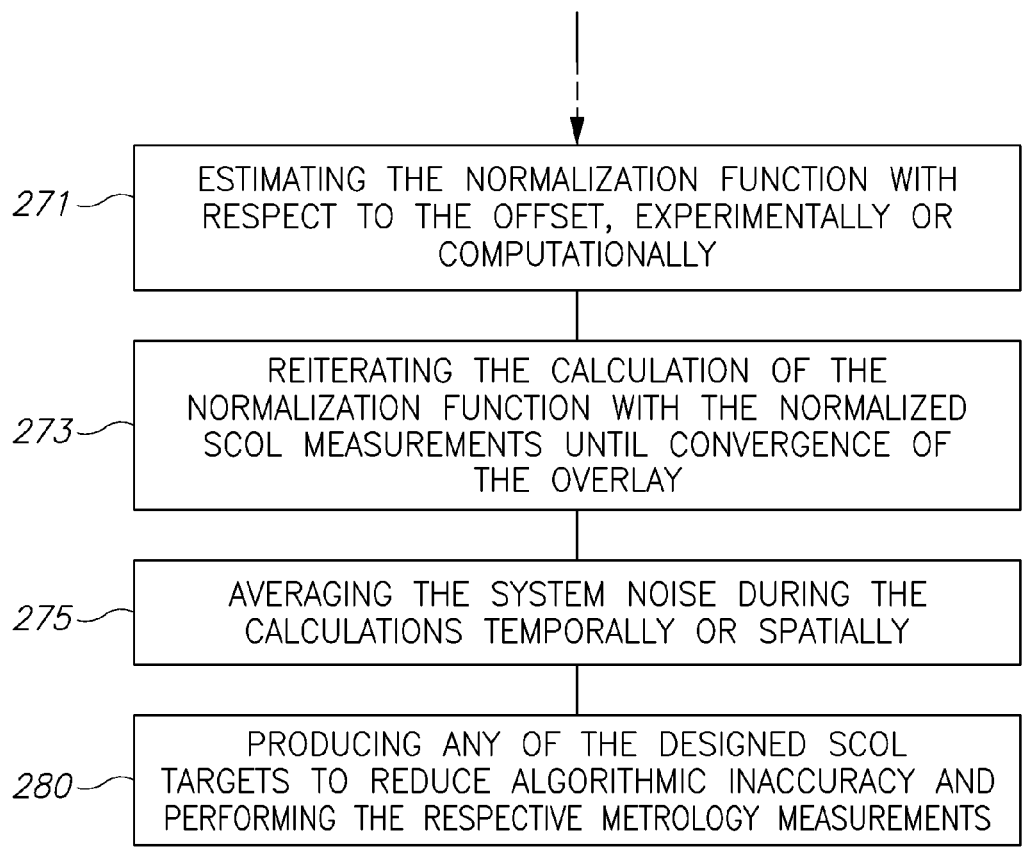
Figure 4 (cont. 4)

US 9,869,543 B2

REDUCING ALGORITHMIC INACCURACY IN SCATTEROMETRY OVERLAY METROLOGY

CROSS-REFERENCE TO RELATED APPLICATIONS

This application is filed under 35 U.S.C. §120 and §365(c) as a continuation of PCT International Patent Application No. PCT/US2013/069236, filed Nov. 8, 2013, which application claims the benefit under 35 U.S.C. §119(e) of U.S. Provisional Patent Application No. 61/724,740, filed Nov. 9, 2012 and U.S. Provisional Patent Application No. 61/724,769, filed Nov. 9, 2012, which applications are incorporated herein by reference.

FIELD OF THE INVENTION

The present invention relates to the field of metrology, and more particularly, to scatterometry overlay metrology.

BACKGROUND OF THE INVENTION

Scatterometry overlay (SCOL) metrology is used to measure overlay between wafer layers from the phases of diffraction orders generated by the individual wafer layers in the SCOL targets. The derivation of the overlay is based on an algorithmic processing of the measurements which takes into account the optical interaction between the illumination, the target structure and the detection system.

SUMMARY OF THE INVENTION

One aspect of the present invention provides a method of minimizing algorithmic inaccuracy in scatterometry overlay (SCOL) metrology, comprising designing SCOL targets that exhibit a functional dependency of the SCOL signal on the SCOL offset that is a sum of oscillatory functions whose oscillation frequencies are smaller than a pre-determined cutoff frequency.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout, wherein.

DETAILED DESCRIPTION OF THE INVENTION

Figure 1:
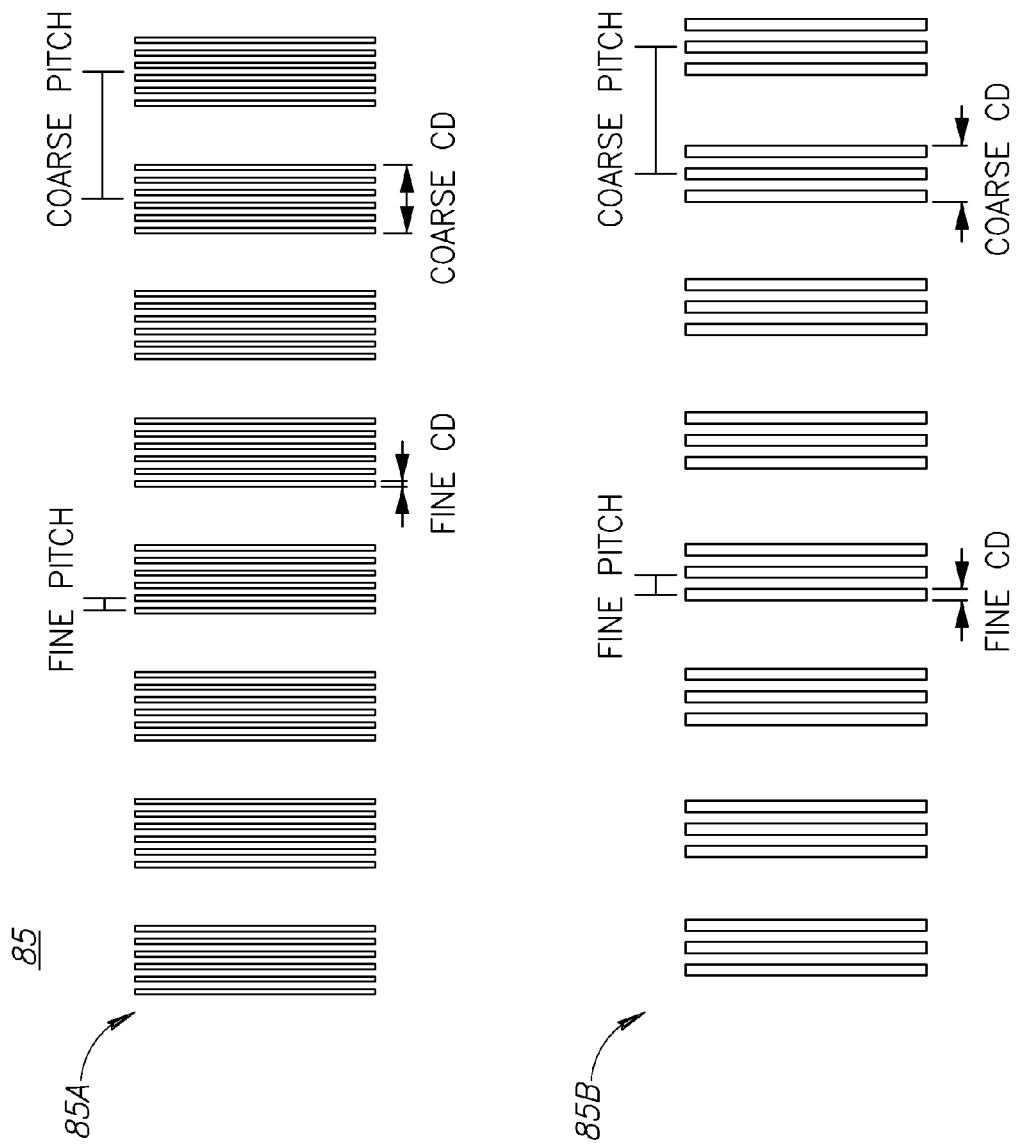
FIG. 1 is a high level schematic illustration of a SCOL target having two segmented gratings at different layers, according to some embodiments of the invention.

Prior to the detailed description being set forth, it may be helpful to set forth definitions of certain terms that will be used hereinafter.

The term "scatterometry overlay (SCOL)" as used in this application refers to a metrology method that derives metrology information from the phases of diffraction orders (e.g., the +1 and −1 diffraction orders) that reflect off targets which contain periodic structures such as gratings or grating cells.

The terms "target" or "metrology target" as used in this application refers to a region from which metrology information is extracted. Metrology targets may be positioned on dedicated areas on the wafer, on device edges or within the device area.

The term "periodic structure" as used in this application refers to any kind of designed or produced structure in at least one layer which exhibits some periodicity. The periodicity is characterized by its pitch, namely its oscillation frequency. In the present application, periodic structures are occasionally referred to in a non-limiting manner as "grating" as these are simple and common periodic structures that are used for metrology. Such use however is not to be understood as limiting the term "periodic structure" in any way. The term "doubly periodic structure" as used in this application refers to a periodic structure having a coarse pitch and exhibiting segmented features which are periodic and have a fine pitch.

The term "mode" as used in this application refers to a diffraction mode corresponding to a diffraction order, which is one of the eigenfunctions of the electromagnetic equations that describe the diffraction of radiation on the periodic structure(s). The term "evanescent mode" as used in this application refers to a mode which decays exponentially with the distance from the respective periodic structure and the term "propagating mode" as used in this application refers to a mode which yields a propagating electromagnetic wave. The terms "mode", "evanescent mode" and "propagating mode" may refer to one of the periodic structures in a target, to parts of periodic structures or to the target as a whole.

The term "oscillation frequencies" as used in this application refers to any one of the frequencies in the expansion of the periodic expression for the dependency of the SCOL signal on the offset (see Equations 1A and 1B below). In particular, each one of the oscillation frequencies represents a mode as defined above, some of the modes being propagating modes while most of the modes being evanescent modes.

The term "spectral response" as used in this application refers to the functional dependency of the SCOL signal on the diffraction order.

The terms "cell" or "grating cell" as used in this application refer to an area which includes at least one periodical structure for metrology measurements. Metrology targets may comprise one or more cell, which comprises periodic structures on one or more layers. Different cells may comprise distinct structures or different areas or parts of a single structure.

The term "segmentation" as used in this application with respect to elements of target, such as but not limited to coarse bars of a grating, refers to re-designing the respective element as being composed of a periodic structure with finer characteristics than the coarse element, such as a fine pitch, a fine critical dimension (CD), and a specified profile.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting.

Methods and systems for minimizing of algorithmic inaccuracy in scatterometry overlay (SCOL) metrology are provided. SCOL targets are designed to limit the number of oscillation frequencies in a functional dependency of a resulting SCOL signal on the offset and to reduce the effect of higher mode oscillation frequencies. The targets are segmented in a way that prevents constructive interference of high modes with significant amplitudes, and thus avoids the inaccuracy introduced by such terms into the SCOL signal. Computational methods remove residual errors in a semi-empirical iterative process of compensating for the residual errors algorithmically or through changes in target design.

The following illustrates in a non-limiting manner target design rules which may be used as initial guidelines to design segmented targets that produce SCOL signals that minimize algorithmic inaccuracy and as a basis for a semi-empirical iterative process of using the principles disclosed below to further reduce the algorithmic inaccuracy, by re-designing the targets and/or by computationally applying corrections to the SCOL signal and/or to its normalization.

FIG. 1 is a high level schematic illustration of a SCOL target 85 having two segmented gratings 85A, 85B at different layers, according to some embodiments of the invention. While an unsegmented grating exhibits features with a coarse pitch of hundreds of nm, a scale which is above and beyond typical design rule feature sizes, gratings in target 85 are segmented to comply with design rule feature sizes (tens of nm), and exhibit relative large spaces between groups of features. Unsegmented gratings are non-limiting examples for a periodic target structure and segmented gratings 85A, 85B are a non-limiting example for a doubly periodic target structure. The segmentation of target elements comprises re-designing coarse elements as periodic structures with specified profile characteristics such as a fine pitch, a fine critical dimension (CD), specified feature heights, specified side wall angles etc. The segmentation characteristics may be optimized to minimize algorithmic inaccuracy, using simulations and/or measurements conducted according to the disclosed methods and concepts.

Figure 2A:
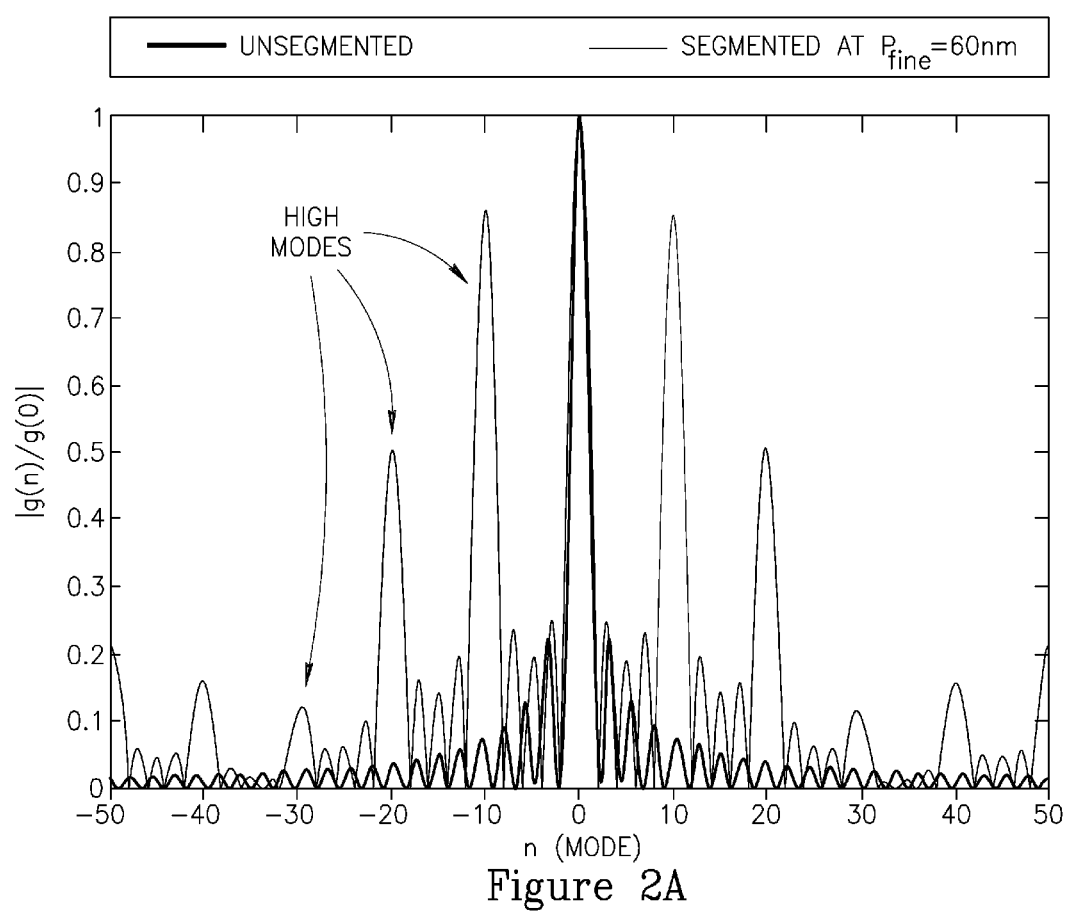
FIG. 2A is a diagram that compares the spectral responses of a segmented and an unsegmented target, in a non-limiting example.
Figure 2B:
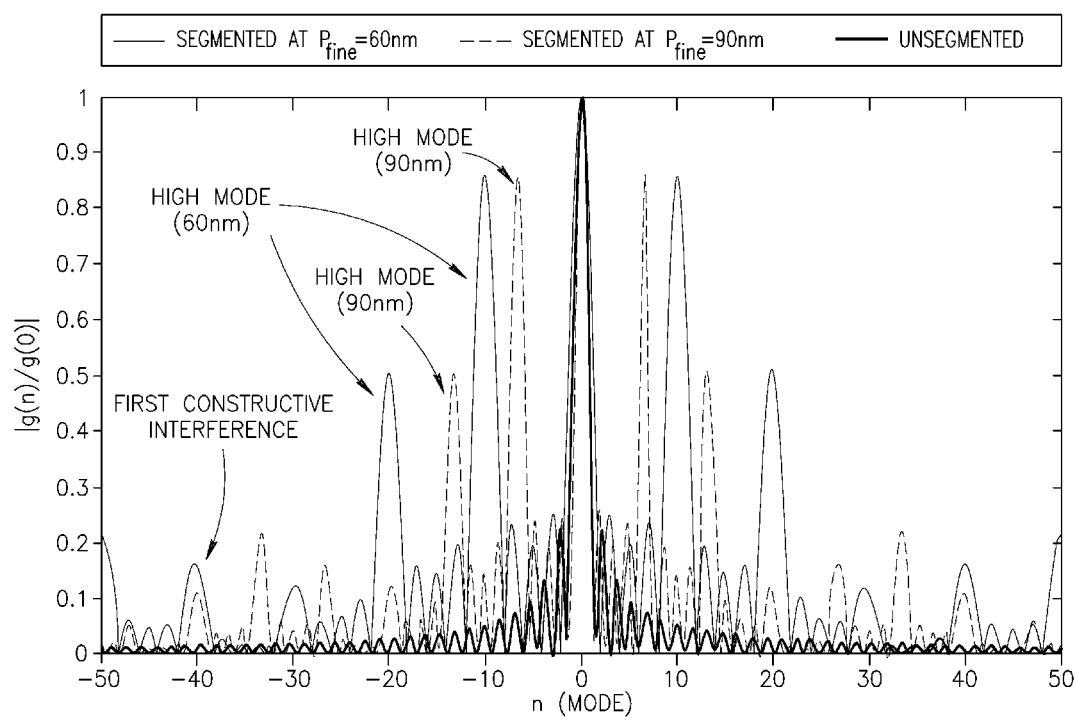
FIG. 2B is a schematic illustration of a spectral response resulting from a selection of the fine pitches to avoid constructive interference, according to some embodiments of the invention.

In certain embodiments, the segmentation characteristics of segmented gratings 85A, 85B is selected to avoid constructive interference of high modes, which results in transforming evanescent (exponentially decaying) high diffraction modes (e.g., ±10, ±20) into propagating low modes (e.g., ±1) which contributes to the measurement inaccuracy. Such selection is carried out according to rules presented below. FIG. 2A is a diagram that compares the spectral responses of a segmented and an unsegmented target, in a non-limiting example. FIG. 2B is a schematic illustration of a spectral response resulting from a selection of the fine pitches to avoid constructive interference, according to some embodiments of the invention.

Figure 3:
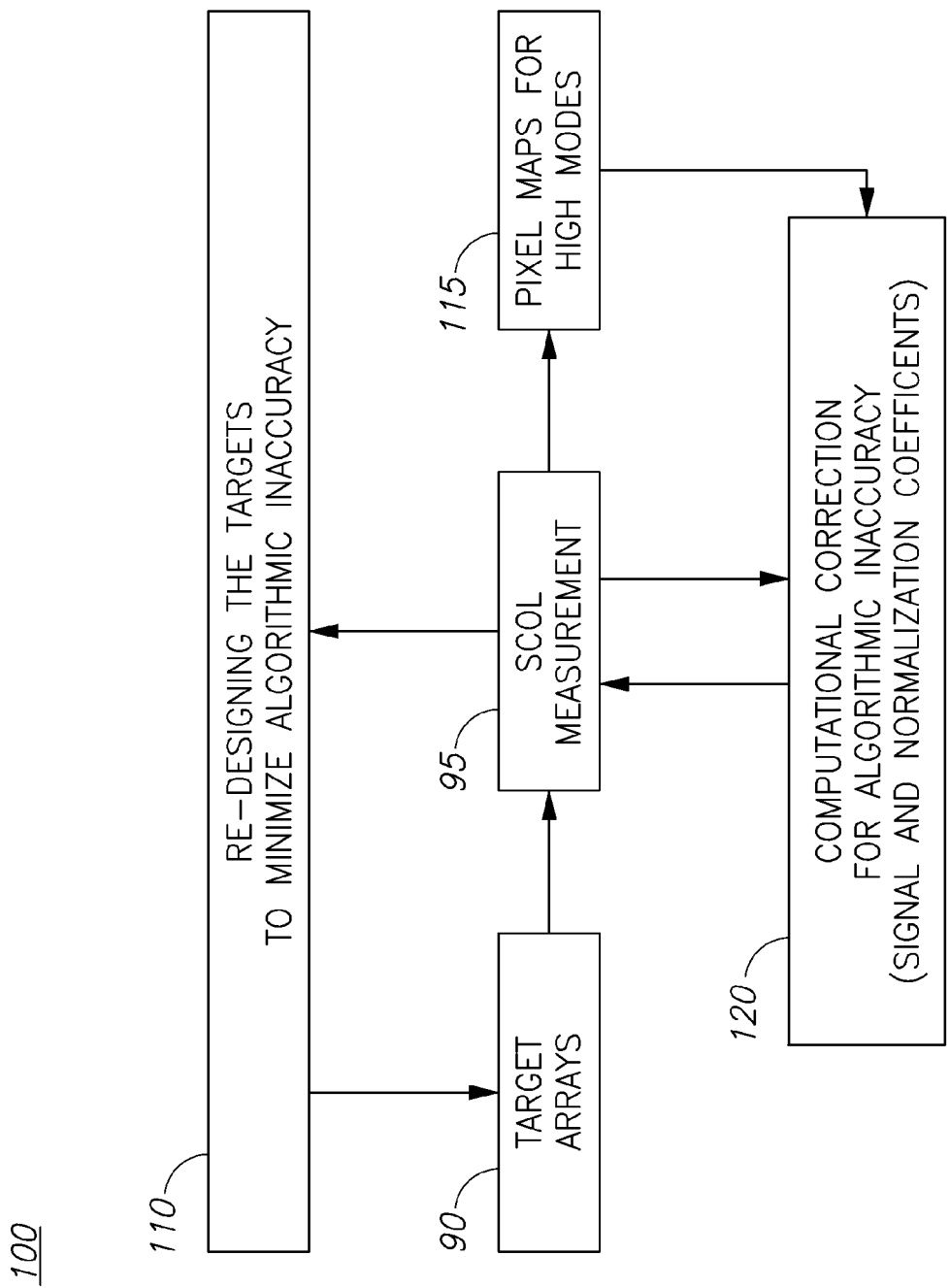
FIG. 3 is a high level schematic block diagram illustrating the minimization of algorithmic inaccuracy in scatterometry overlay (SCOL) metrology by design as well as algorithmic means, according to some embodiments of the invention; and, FIG. 4 is a high level schematic flowchart of a method of minimizing algorithmic inaccuracy in scatterometry overlay (SCOL) metrology, according to some embodiments of the invention.

FIG. 3 is a high level schematic block diagram illustrating the minimization of algorithmic inaccuracy in scatterometry overlay (SCOL) metrology by design as well as algorithmic means, according to some embodiments of the invention. FIG. 3 outlines the minimization as involving target arrays 90 which undergo SCOL measurements 95 that are used to re-design the targets to minimize algorithmic accuracy 110, possibly in an iterative process, and are further used to computationally correct for algorithmic inaccuracy 120 (e.g., by correcting the signal and/or normalization coefficients), possibly based on generated pixel maps that approximate high modes 115, again, possibly in an iterative process. Aspects of these operations are explained below in detail.

Figure 4:
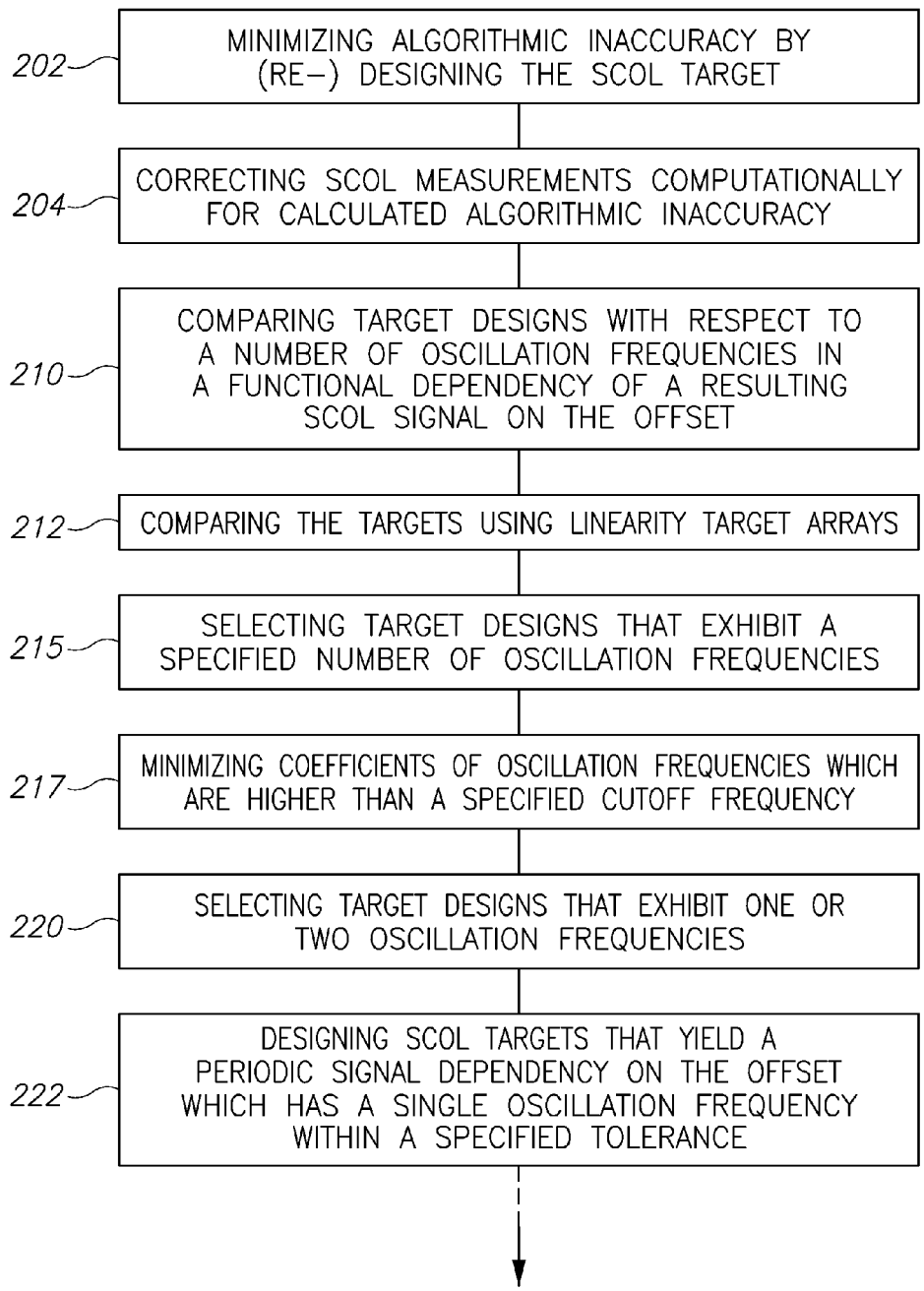

FIG. 4 is a high level schematic flowchart of a method 200 of minimizing algorithmic inaccuracy in scatterometry overlay (SCOL) metrology, according to some embodiments of the invention. Method 200 comprises minimizing algorithmic inaccuracy by designing (or re-designing) the SCOL target (stage 202), possibly optimizing SCOL targets to produce minimized algorithmic inaccuracy (stage 250), as well as correcting SCOL measurements computationally for calculated algorithmic inaccuracy (stage 204), as explained in detail below. Method 200 may comprise producing any of the designed SCOL targets to reduce algorithmic inaccuracy and performing the respective metrology measurements (stage 280).

Scatterometry overlay (SCOL) targets are commonly non-design-rule targets, which include features or spaces as large as 400 nm. A typical SCOL target consists of several cells, each consisting of two gratings (one in each of the layers between which the overlay is measured). In this grating the typical size of a feature or a space is hundreds of nanometers, in contrast with design rule features, which are tens of nanometers in size. The features of a SCOL target are sometimes segmented (segmented gratings 85A, 85B) for better process compatibility to comprise a fine pitch in the order of tens of nanometers, similarly to the design rule of the device. SCOL targets may comprise at least two doubly periodic structures exhibiting a coarse pitch and a fine pitch, in at least two layers.

The sought for overlay between the two layers may be extracted from the SCOL signals by assuming a certain functional form, F, for the dependence of the SCOL signals on the total offset, OF, of the cells (the total offset is equal to the sum of the programmed offset of the cell and the overlay of the target). In reality, the function F(OF) depends on the wafer, on the site (through process variations), on the properties of the incoming light (such as wave-length and polarization), on the pupil pixel, and on the size of the cells. For large enough cell sizes one can assume that F(OF) is a periodic function which satisfies the equation F(OF)=F(OF+Pitch), and hence may be expressed as Equations 1A or 1B below, depending on the symmetry properties of F(OF) (which depend on the SCOL technology).

$$F(OF) = \sum_{n=0}^{\infty} A_n \cos\left(\frac{2\pi n}{\text{Pitch}} OF\right) \quad \text{Equation 1A}$$

$$F(OF) = \sum_{n=1}^{\infty} A_n \sin\left(\frac{2\pi n}{\text{Pitch}} OF\right) \quad \text{Equation 1B}$$

Pitch denotes the pitch of the periodic structure, and $A_n$ are model coefficients.

The periodic function F(OF), which represents the functional dependency (spectral response) of the resulting SCOL signal on the offset, thus may be represented as a sum of different oscillation frequencies.

In certain embodiments, SCOL targets 85 are designed to exhibit a pre-defined number of oscillation frequencies in this functional dependency of a resulting SCOL signal on the offset F(OF). For example, SCOL targets may be designed to exhibit, within a specified tolerance, one or two oscillation frequencies, e.g., F(OF)=A cos (2πOF/Pitch)+B cos (4πOF/Pitch). In certain embodiments, in which SCOL targets are designed to exhibit two oscillation frequencies, one frequency may be double the other as illustrated in the above example.

In certain embodiments, SCOL targets 85 are designed to yield a functional dependency of a SCOL signal on a SCOL offset (such as the functional dependencies exemplified in Equations 1A, 1B) which comprises a pre-defined number of oscillatory functions, within a specified accuracy requirement. For example, targets 85 may be designed to yield a functional dependency of a SCOL signal on a SCOL offset which comprises only one or two oscillatory functions, or does so within a specified inaccuracy requirement. Such inaccuracy requirement may be set to be at most one of 10%, 5%, 1%, 0.5% or 0.1%, depending on specifications. In certain embodiments, target 85 may be designed to yield oscillation frequencies of the oscillatory functions which are smaller than a specified cutoff frequency (for example, a cutoff frequency which is double than the lowest of the oscillation frequencies).

In addition, certain realizations of the SCOL technology may suffer from significant system noise that modifies the measured value of the signal F by a multiplicative and pixel independent factor. This factor may be denoted by f(t), reflecting its dependence on the measurement time t. This system noise causes a precision degradation, and one way to circumvent this degradation is to normalize the signal $F_i$ measured on cell i (at time $t_i$) by a different signal which is also proportional to $f(t_i)$. An example for such a signal is the pupil pixel average of the image. Denoting this normalization factor (modulo its f(t) pre-factor) by N(OF), its dependence on OF may be expressed as the normalized pupil signal (Equations 2A or 2B, depending on the signal symmetry):

$$F_{normalized}(OF) \equiv \frac{F(OF)}{N(OF)} = \frac{\sum_{n=0}^{\infty} A_n \cos\left(\frac{2\pi n}{\text{Pitch}} OF\right)}{\sum_{n=0}^{\infty} B_n \cos\left(\frac{2\pi n}{\text{Pitch}} OF\right)} \quad \text{Equation 2A}$$

$$\equiv \sum_{n=0}^{\infty} A_{normalized,n} \cos\left(\frac{2\pi n}{\text{Pitch}} OF\right)$$

$$F_{normalized}(OF) \equiv \frac{F(OF)}{N(OF)} = \frac{\sum_{n=1}^{\infty} A_n \sin\left(\frac{2\pi n}{\text{Pitch}} OF\right)}{\sum_{n=0}^{\infty} B_n \cos\left(\frac{2\pi n}{\text{Pitch}} OF\right)} \quad \text{Equation 2B}$$

$$\equiv \sum_{n=0}^{\infty} A_{normalized,n} \sin\left(\frac{2\pi n}{\text{Pitch}} OF\right)$$

Equations 2A and 2B express the fact that good normalization signals are symmetric functions of the offset, so that the symmetry properties of $F_{normalized}(OF)$ is identical to the symmetry properties of F(OF). Also, these equations define the normalized mode coefficients $A_{normalized,n}$ and imply that the nominal algorithm applied to the normalized signal assumes that $B_{n>0}=0$. In the following it is assumed that operations applied to the ordinary mode coefficients may also be applied to the normalized mode coefficients and that design and algorithmic considerations may relate to either the original signals and/or the normalized signals.

Current SCOL technologies are restricted in that they rely on extracting the overlay from a finite, and comparably small, number of cells, denoted in the following by M. For example, in $0^{th}$ order technology M≥8, and in $1^{st}$ order technologies M≥4 (the value of M relates to the direction in respect to which the overlay is extracted). Working with a fixed value of M means that the overlay extraction algorithm assumes that the number of terms in the sums appearing in Equations 1A or 1B are restricted. Specifically, in $1^{st}$ order technologies, with M=4, the algorithm assumes that Equation 1B is correct and truncates the sum at $n_{truncate}=1$. In $0^{th}$ order technologies (with M=8) the SCOL algorithm assumes Equation 1A is correct and truncates the sum at $n_{truncate}=1$ (or at $n_{truncate}=2$ if the programmed offsets are chosen judicially).

The truncation (cutoff) mentioned above is a clear disadvantage of the current SCOL technology because its current algorithms assume that the coefficients $A_n$ obey $A_{n>n_{truncate}}=0$ or at least assume that the coefficients $A_n$ decrease with n, and that the error induced by the algorithm neglect of $n \geq n_{truncate}$ is small. However, the error induced by the breakdown of this assumption, termed "algorithmic inaccuracy", is generically uncontrolled, and causes an overlay inaccuracy which depends on pupil pixel, programmed offsets, site, on the properties of the incoming light, on the target size, on the target design, and on the type of normalization factor used in the algorithm. Even if the assumption $A_{n \geq n_{truncated}}=0$ does hold for the un-normalized signals, it is theoretically expected, and was indeed verified by the inventors in simulations, that the normalization factor N(OF) may have a strong OF dependence for certain processes, thereby inducing a breakdown of the assumptions discussed above for the normalized signal. Put differently, the N(OF) offset dependence induces nonzero values for $A_{normalized, n \geq n_{truncated}}$, which in turn cause an overlay inaccuracy when the nominal SCOL algorithm is applied to the normalized signal.

Avoiding Evanescent Waves Enhancement of High Modes

The inventors have found out that the size of the higher n values in the sums of Equations 1A, 1B is determined by the contribution of high diffraction orders of each of the two gratings within the cell (the lower and the top gratings). While these diffraction orders are evanescent when propagating to the detector the following phenomenon takes place. A highly evanescent wave, which corresponds to a diffraction order m, propagates from the bottom to upper grating, interferes with another highly evanescent wave belonging to the upper grating and corresponding to a diffraction order m'=−m+1. If 1=±1 or 0, the interference between the two waves is contributing to the grating-over-grating propagating wave of order $m_{total}$=m+m'=1, and easily reaches the detector. Importantly, the inventors have shown that this propagating wave contributes to the n=m mode in Equations 1A, 1B.

Hence, when a single grating has significant diffraction efficiency for an evanescent mode m, it is likely to contribute to the $m^{th}$ mode in the mode expansion of Equations 1A, 1B. The inventors have used models and simulations to know when a certain evanescent mode is enhanced, and reach the result that segmented targets are likely to cause such enhancement. Indeed, simple models show that a grating of coarse Pitch equal to $P_{coarse}$, which is segmented by a fine segmentation pitch $P_{fine}$, enhances the diffraction efficiency of the following modes:

$$n_{enhanced} = \frac{P_{coarse}}{P_{fine}} \times l, l = \pm 1, \pm 2, \ldots \qquad \text{Equation 3}$$

For reasons of continuity, if such $n_{enhanced}$ exists, then the near-by diffraction orders, for example $n_{enhanced} \pm 1$, are also enhanced.

Segmented SCOL targets 85, which have two segmented gratings with the same coarse pitch $P_{coarse}$ and differing fine pitches $P_{fine, 1}$ (top grating) and $P_{fine, 2}$ (bottom grating), have two relevant sets of integers $n_{enhanced,1}$ and $n_{enhanced,2}$ which obey Equations 3A and 3B:

$$n_{enhanced,1} = \frac{P_{coarse}}{P_{fine,1}} \times l_1, l_1 = \pm 1, \pm 2, \ldots , \qquad \text{Equation 3A}$$

and $$n_{enhanced,2} = \frac{P_{coarse}}{P_{fine,2}} \times l_2, l_2 = \pm 1, \pm 2, \ldots . \qquad \text{Equation 3B}$$

Equation 3A describes the enhanced modes of the bottom grating and Equation 3B describes the enhanced modes of the top grating.

If there exist integers $l_1$ and $l_2$ such that $\pm n_{enhanced,1} \pm n_{enhanced,2}$ is a number close to a diffraction order of a propagating mode, then this propagating mode carries information on the evanescent modes $n_{enhanced,1}$ and $n_{enhanced,2}$ thereby leading to large oscillation modes $n_{enhanced,1}$ and $n_{enhanced,2}$ in the dependency of the SCOL signal on the offset (Equations 1A, 1B), and in turn leading to significant algorithmic inaccuracy.

For example, for binary (two-layer) grating 85 that is segmented by N bars and has a coarse line width $CD_{coarse}$=N ($P_{fine}$−1)−$CD_{fine}$−the spectral response of the grating at order n, g(n), is given by Equation 4.

$$g(n) = \frac{\sin\left(\frac{\pi n CD_{fine}}{P_{coarse}}\right)}{\pi n} \times \left[ \begin{array}{l} N \qquad n_{enhanced} = \frac{P_{coarse}}{P_{fine}} \times l \\ \frac{\sin\left(\frac{\pi n P_{fine} N}{P_{coarse}}\right)}{\sin\left(\frac{\pi n P_{fine}}{P_{coarse}}\right)} \quad \text{else} \end{array} \right. \qquad \text{Equation 4}$$

Thus, resonances occur at $n_{enhanced}$, in agreement with Equation 3.

FIG. 2A is a diagram that compares the spectral responses of a segmented and an unsegmented target, in a non-limiting example. A plot of the spectral response g(n) of the segmented grating is shown for the values $P_{coarse}$=600 nm, N=5, $P_{fine}$=60 nm, $CD_{fine}$=20 nm (CD—critical dimension, denotes the width of the respective segments), alongside with a plot of the spectral response of an un-segmented target with $CD_{coarse}$=N($P_{fine}$−1)−$CD_{fine}$=258 nm. As clearly observed in FIG. 3A, the segmented target exhibits resonances at $n_{enhanced}$=±10, ±20 etc.

Generally, the high mode resonances in the spectral response are evanescent. However, in case the segmented spectral responses of both the upper and the lower gratings are similar and reach resonances at or near similar values (e.g., integer multiples of 10 in the case presented in FIG. 3A), the enhanced high order diffraction order of the bottom grating (e.g., +10) interferes with a corresponding enhanced order of the upper grating (e.g., −9) to yield a propagating mode (in the current example +10−9=+1 mode) that reaches the detector. This contribution to the propagating mode depends on the SCOL offset in a way that oscillates with the $10^{th}$ mode of the coarse pitch (n=10 in Equations 1A, 1B) thereby contributing significantly to the algorithmic inaccuracy.

To generalize the given example, the constructive interference of high mode oscillation frequencies takes place when there are two integers $l_1$ and $l_2$ that satisfy Equation 5:

$$\frac{P_{coarse}}{P_{fine,1}} \times l_1 \cong \frac{P_{coarse}}{P_{fine,2}} \times l_2. \qquad \text{Equation 5}$$

The smaller $l_1$ and $l_2$ are, the larger the effect is on the inaccuracy that is introduced into the measurement, since the actual strength of the resonances decrease with the value of $l_1$ and $l_2$. Hence, in certain embodiments, the coarse and fine pitches are selected to avoid satisfying Equation 5 for small values of $l_1$ and $l_2$.

In certain embodiments, the SCOL target may be designed to suppress enhancement of high evanescent modes between the target layers according to the above stated considerations, e.g., designing the fine pitches in the two layers such that only large integers $l_1$ and $l_2$ satisfy Equation 5 and the difference between the expressions on either of its sizes is large.

FIG. 2B is a schematic illustration of a spectral response resulting from a selection of the fine pitches to avoid constructive interference, according to some embodiments of the invention. In the example presented in FIG. 3B, the unsegmented target is compared with two segmented targets, one having $P_{fine}$60 nm and the other having $P_{fine}$=90 nm (the two segmentations represent the upper and lower grating in target 85). The first (and strongest) modes do not coincide between the different segmentation until the $40^{th}$ diffraction order, and by then they are weak, so that their constructive interference does not yield a large signal and hence does not contribute much to the inaccuracy. The smallest integers that satisfy Equation 5 with the substituting fine pitch values are $l_1=4$ and $l_2=6$, which are relatively large.

In certain embodiments, targets 85 may be segmented in a way that does not comply with Equation 5 for $l_1$ and $l_2$ being 1, 2 or 3 in any combination, or, stated differently, with the fine pitches having a ratio that is different from any of: 1, 2, 3, 1/2, 1/3, 2/3 and 3/2. In certain embodiments, targets 85 may be segmented in a way that does not comply with Equation 5 for $l_1$ and $l_2$ smaller than three and $l_1+l_2$ smaller than eight, or similar rules.

In certain embodiments, targets 85 may be segmented in a way that prevents constructive interference of any mode higher than two, or that prevents constructive interference of high modes which have an amplitude that is larger than a threshold value (e.g., 10% of the main signal modes).

With respect to the nearly equal ($\cong$) sign in Equation 5, the equality may be defined to be within a certain range that prevents constructive interference of the respective modes, e.g., a range that assures that the peaks of the respective modes are not with one, two or three standard deviations ($\sigma$'s). Alternatively or additionally, the range within which the two sides of the equation are to be considered equal may be defined in terms of the overall inaccuracy that is introduced into the SCOL signal as the product of all enhanced high modes. For example, a specified inaccuracy requirement maybe set at 10%, 5%, 1%, 0.5% or 0.1% to define the maximal allowed contribution of enhanced high modes.

Method 200 may comprise designing a SCOL target to yield a functional dependency of a SCOL signal on a SCOL offset which comprises a pre-defined number of oscillatory functions, within a specified inaccuracy requirement. The SCOL target may be designed to make the oscillation frequencies of the oscillatory functions smaller than a specified cutoff frequency. For example, the specified cutoff frequency may be double than the lowest of the oscillation frequencies. In certain embodiments, the pre-defined number of oscillatory functions is one or two. The specified inaccuracy requirement may be set, according to specifications, at e.g., 10%, 5%, 1%, 0.5%, 0.1%.

In certain embodiments, the SCOL targets may comprise at least two layers and be designed to suppress high mode evanescent waves enhancement between the target layers and prevent constructive interference of high modes between the layers that surpasses the specified inaccuracy requirement (stage 232).

In particular, the segmentation of the SCOL target may be selected to defy Equation 5 within the inaccuracy requirement (stage 235), e.g., for low $l_1$ and $l_2$ values such as values below 3 or below 5. For example, the SCOL targets may comprise a segmented periodic structure at each of two layers having equal coarse pitches and fine pitches having a ratio that is different from any of: 1, 2, 3, 1/2, 1/3, 2/3, 3/2.

Method 200 may comprise any of the stages: designing (or re-designing) SCOL targets which suppress high mode evanescent waves enhancement between target layers (stage 230), designing SCOL targets having doubly periodic structures exhibiting a coarse pitch and a fine pitch, in which the coarse pitch is not a multiple of the fine pitch, selecting a fine segmentation of a periodic target structure to prevent enhancement of diffraction modes which are not part of a specified periodic signal dependency on the offset (stage 234), selecting a coarse pitch and a combination of fine pitch values at the different layers that do not satisfy Equation 5 for $n_{enhanced}$ or that satisfy it for only very large values of $n_{enhanced}$ whose amplitude in the spectral response is very small (as measured by their contribution to the overall inaccuracy, being e.g., lower than any of 10%, 5%, 1%, 0.5%, 0.1%, according to specified requirements).

Certain embodiments provide target designs that produce SCOL signals that can be described, to a good accuracy, by the sums in Equations 1A, 1B, truncated to $n=n_{truncate}$. Target design may be derived or refined within a learning and/or development stage whereby linearity arrays (arrays of multiple target designs having gradually changing programmed offsets) are printed on the same wafer and fitted to the form of Equations 1A, 1B. The best design may then be chosen according to a weight function that minimizes the size of $A_{n>n_{truncated}}$. Target designs which involve segmentations are a good example for a case where the empirical development can be guided by theoretical considerations. For example, SCOL targets may be designed to produce SCOL signals that can be described, to good accuracy, by the sums in Equations 1A, 1B, truncated to n=1 for $1^{st}$ order and to n=1 (or 2 depending on the choice of programmed offsets). This is achieved by designing segmented gratings for which it is unlikely that the conditions described by Equation 5 take place, and that if they do, these designs suppress the high mode enhancement (see above).

In certain embodiments, the following target design rules may be introduced. First, the targets may be segmented with the smallest segmentation pitch possible, in order to make the ratio $$\frac{P_{coarse}}{P_{fine}}$$

as large as possible, and so the phenomenon described above may be viable only if very highly evanescent modes survive the propagation from the bottom to top grating. Such modes are likely to survive with very small amplitude, thereby causing a minor algorithmic inaccuracy in the overlay measurement.

Second, the top and bottom gratings may be segmented with different segmentations. Since Equation 3 has to hold for both the top and bottom gratings, segmenting the two gratings with different segmentation pitches is likely to decrease the overlay inaccuracy. The benefit of using different segmentations is exemplified further (in addition to the above description) by comparing the following two cases:

Case 1: $P_{coarse}=N \times P_{fine,1}=N \times P_{fine,2}$. In this case the first mode which is enhanced according to Equation 3 is $n_{enhanced}=\pm N$ (the Nth mode in Equations 1A, 1B is enhanced by the diffraction orders $m \pm N$ and $-(m \pm N) \pm 1$, for the bottom and top gratings respectively.

Case 2: $P_{coarse}=N \times P_{fine,1}=2N \times P_{fine,2}$. In this case the discussion regarding case 1 above is the same, but with N replaced by 2N. Since it is likely that an evanescent mode 2N will survive the propagation between the two gratings with comparably small amplitude, the overlay inaccuracy in case 2 is smaller than in case 1.

Third, the top and bottom gratings may be segmented with in-commensurate pitch values so that Equation 5 cannot be obeyed for the two gratings simultaneously, and if it does, it is for large values of modes, where the spectral response's amplitude is small. In this case Equation 6 presented below provides the condition for the minimally allowed difference between segmentation pitches to avoid the simplest Moiré type phenomena (see below). Straightforward generalizations of Equation 6 determine the corresponding conditions which avoid the Moiré phenomena between higher modes of the individual gratings.

In certain non-limiting embodiments, method 200 may comprise selecting target designs exhibiting one or two oscillation frequencies (stage 220), designing SCOL targets that yield a periodic signal dependency (spectral response) on the offset having a single oscillation frequency, within a specified tolerance (e.g., within specified inaccuracy requirements) (stage 222) and designing SCOL targets that yield a periodic signal dependency on the offset having two oscillation frequencies, one being two times the other, within a specified tolerance (stage 224).

Avoiding Moiré Patterns

The above discussion focused on a single illumination pupil point $\vec{k}_{illumination}$, and discussed the target designs which cause a significant algorithmic inaccuracy in the overlay, as measured on the collection pupil points that correspond to light reflecting back from $\vec{k}_{illumination}$ (for example, for $0^{th}$ order SCOL technologies, the collection pupil obeys $\vec{k}_{collection} = -\vec{k}_{illumination}$).

In case the illumination pupil contains more than a single point, and if the upper and/or the bottom gratings 85 have segmentation pitches that are not equal, but close in value, another possibility for algorithmic inaccuracy arises. Specifically, when the segmentation pitches are only slightly different from each other, double scattering on both segmentation gratings may create a Moiré pattern corresponding to any propagating mode which is within the collection detector. Such addition to the signal measured in the pupil plane leads to algorithmic inaccuracy. For example, assuming two segmentation pitches $P_1$ and $P_2$, the Moiré pitch is $$P_{Moire} = \frac{P_1 \cdot P_2}{P_1 - P_2}.$$

The condition that the resulting Moiré wave is not detected in the detection pupil is $$\left|\frac{\lambda}{P_{Moire}}\right| \geq NA_{ill} + NA_{col},$$

where $\lambda$ is the light wavelength, $NA_{ill}$ is the numerical aperture at illumination and $NA_{col}$ is the numerical aperture at the collection. Accordingly, the condition presented as Equation 6 ensures minimal inaccuracy due to this Moiré related effect (for $P_1 > P_2$, as a non-limiting example):

$$\frac{P_2}{P_1} \leq \frac{\lambda/([NA_{ill} + NA_{col}] \cdot P_1)}{1 + \lambda/([NA_{ill} + NA_{col}] \cdot P_1)} \quad \text{Equation 6}$$

Equation 6 thus provides a condition on the minimally allowed difference between the segmentation pitches so that the process described in the above paragraphs be avoided. In certain embodiments, SCOL targets are designed with fine pitches that satisfy Equation 6 in order to avoid formation of Moiré patterns.

In certain embodiments, combinations of different modes of segmentation pitches are treated similarly to prevent the formation of Moiré patterns, particularly in cases in which the segmentation pitches are not close to each other. A generalization of Equation 6 for the general case is straightforward.

Method 200 may comprise selecting the fine and the coarse pitches to avoid formation of a Moiré pattern between the layers (stage 240), e.g., by selecting the fine and the coarse pitches to satisfy Equation 6 (stage 242).

In certain embodiments, method 200 may comprise selecting incommensurate fine pitch values for periodic structures in different layers of a SCOL target (stage 244), segmenting the top and bottom periodic structures differently (stage 246) and correcting, semi-empirically, for algorithmic inaccuracy which is due to multiple high modes in the expansion of the SCOL signal in the offset (stage 252).

Calibration of the Normalization Factors

Returning to Equations 2A and 2B, the normalized signal may be used to perform the calibration measurements for the normalizing factors N(OF) (instead or in addition to the signal F(OF)) and obtain the $B_{n>0}$ coefficients, that are assumed to be zero when the nominal algorithm is applied to the normalized signal. Denoting the experimentally determined values of $B_{n>0}$ by $B_{n>0}^{estimated}$, the in-production measurements may be fitted to the form of Equations 2A and 2B, with $B_{n>0}$ set to $B_{n>0}^{estimated}$. This modification of the SCOL algorithm decreases the overlay inaccuracy in measurements that are based on the normalized signal.

In the following, the calibration measurement is exemplified in a non-limiting manner for the $1^{st}$ order SCOL technology. First, pupil images are captured at each target. Then, assuming $$\sum_{n=1,2,3,\ldots} B_n \cos\left(\frac{2\pi n}{\text{Pitch}} OF\right) = 0,$$

the overlay at each target (at each pixel) is calculated using this assumption. The normalization factor $$N(OF) \equiv B_0 + \sum_{n=1,2,3,\ldots} B_n \cos\left(\frac{2\pi n}{\text{Pitch}} OF\right)$$

is then measured for each pixel in each pupil image at each target. In this example the normalization factor may be chosen to be the pupil average of the $+1^{st}$ and $-1^{st}$ orders. N(OF) is plotted as a function of estimated total offset, where the estimated total offset for each cell is equal to sum of the programmed offset of each cell and the measured overlay at each target. This process provides an experimental estimate of the function N(OF), or equivalently and using curve fitting, of the values of $B_{n>0}^{estimated}$ mentioned above.

The process may be reiterated until convergence, namely include recalculating the overlay at each site, with the $1^{st}$ order SCOL algorithm modified to account for the normalization factor N(OF) and repeating the stages described above until the overlay converges. This process results in increasingly accurate estimates of the overlay.

The calibrations measurements mentioned above are carried out by averaging the system noise and for large OF values (so that the calibrations are as accurate as possible). One way to achieve the system noise averaging is to use measurements with time-scales that are much larger than the typical time scale of the system noise. To obtain large overlay ranges one can either use linearity arrays as mentioned above, or use a sample of overlay targets that are spread across the wafer.

Accordingly, method 200 may further comprise any of the following stages: capturing pupil images at each target (stage 265), calculating the overlay at each target (at each pixel) without normalization (stage 267), measuring the normalization factor for each pixel in each pupil image at each target (stage 269), estimating the normalization function with respect to the offset, experimentally or computationally (stage 271), reiterating the calculation of the normalization function with the normalized SCOL measurements until convergence of the overlay (stage 273) and averaging the system noise during the calculations temporally or spatially (stage 275).

In certain embodiments, method 200 may further comprise correcting, semi-empirically, for algorithmic inaccuracy which is due to multiple high modes in the expansion of the normalization of the SCOL signal in the offset (stage 260) and adjusting the normalization coefficients to compensate for residual error due to the oscillation frequencies higher than a specified truncation (cutoff) frequency (stage 262).

Given a certain target design for which $A_{n>n_{truncated}} \ll A_{n \leq n_{truncated}}$, certain embodiments comprise using target arrays 90 (e.g., linearity arrays 90 which comprise a set of identical SCOL targets that differ in their designed overlay which changes linearly with the target index) to measure and calibrate coefficients $A_i$, $B_i$ that appear in the sums of Equations 1A, 1B, 2A, 2B. Then, by using these measurements, the pixel maps of $A_{n>n_{truncated}}$ may be approximated and be used to correct the overlay values obtained in the nominal algorithm which assumes that $A_{n>n_{truncated}}=0$. Such process can be repeated iteratively until convergence. The accuracy achieved in this procedure is dictated in part by the size of process variations in the lithography process and by the frequency of that aforementioned calibration.

In certain embodiments, method 200 comprises comparing target designs with respect to a number of oscillation frequencies in a functional dependency of a resulting SCOL signal on the offset (stage 210), e.g., comparing the targets using linear arrays (stage 212), selecting target designs exhibiting a specified number of oscillation frequencies (stage 215) and minimizing coefficients of oscillation frequencies higher than a specified truncation (cutoff) frequency (stage 217).

In certain embodiments, method 200 further comprises approximating pixel maps for oscillation frequencies higher than a specified truncation frequency (stage 252), correcting overlay values for specified targets using the approximated pixel maps (stage 254) and reiterating the approximation and correction stages to converge to a calibrated target (stage 256).

In the above description, an embodiment is an example or implementation of the invention. The various appearances of "one embodiment", "an embodiment", "certain embodiments" or "some embodiments" do not necessarily all refer to the same embodiments.

Although various features of the invention may be described in the context of a single embodiment, the features may also be provided separately or in any suitable combination. Conversely, although the invention may be described herein in the context of separate embodiments for clarity, the invention may also be implemented in a single embodiment.

Certain embodiments of the invention may include features from different embodiments disclosed above, and certain embodiments may incorporate elements from other embodiments disclosed above. The disclosure of elements of the invention in the context of a specific embodiment is not to be taken as limiting their used in the specific embodiment alone.

Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described.

Meanings of technical and scientific terms used herein are to be commonly understood as by one of ordinary skill in the art to which the invention belongs, unless otherwise defined.

While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A method of reducing algorithmic inaccuracy in scatterometry overlay (SCOL) metrology, comprising:
   designing a SCOL target on a sample, the SCOL target including two or more cells, comprising:
      at least one first segmented target structure on a first layer of the sample segmented with a coarse pitch and a first fine pitch; and
      at least one second segmented target structure on a second layer of the sample segmented with the coarse pitch and a second fine pitch, wherein the two or more cells include two or more predetermined offsets between the corresponding at least one first segmented target structure and the at least one second segmented target structure, wherein an overlay signal associated with measured diffraction modes from the two or more cells is indicative of an overlay offset between the first layer and the second layer of the sample, wherein the overlay signal is a periodic function of the overlay offset and is represented by a sum of oscillatory frequencies of different orders;
   selecting the values of the coarse pitch, the first fine pitch, and the second fine pitch to limit, within a specified inaccuracy requirement, an algorithmic error in determining the overlay offset by limiting oscillation frequencies having an order higher than a predetermined cutoff order;
   providing the designed SCOL target on the sample;
   measuring one or more diffraction modes from the two or more cells of the SCOL target with a detector to generate the overlay signal;
   calculating a value of the overlay offset based on the measured overlay signal;
   correcting for the algorithmic error associated with oscillation frequencies of the overlay signal higher than a predetermined cutoff order; and
   updating the value of the overlay offset based on the correction.

2. The method of claim 1, wherein the predetermined cutoff order is one or two.

3. The method of claim 1, wherein selecting the values of the coarse pitch, the first fine pitch, and the second fine pitch to limit the algorithmic error comprises:
selecting the values of the coarse pitch, the first fine pitch, and the second fine pitch to limit the algorithmic error by limiting high mode evanescent waves enhancement between the first layer of the sample and the second layer of the sample.

4. The method of claim 3, wherein selecting the values of the coarse pitch, the first fine pitch, and the second fine pitch to limit the algorithmic error comprises:
selecting the values of the coarse pitch, the first fine pitch, and the second fine pitch to satisfy $$\frac{P_{coarse}}{P_{fine,1}} \times l_1 \cong \frac{P_{coarse}}{P_{fine,2}} \times l_2$$

within the inaccuracy requirement, where $P_{coarse}$ is the coarse pitch, $P_1$ is the first fine pitch, $P_2$ is the second fine pitch, $l_1$ is a first integer, and $l_2$ is a second integer.

5. The method of claim 4, wherein the ratio of the first fine pitch and the second fine pitch is different from any of 1, 2, 3, 1/2, 1/3, 2/3, or 3/2.

6. The method of claim 3, wherein selecting the values of the coarse pitch, the first fine pitch, and the second fine pitch to limit the algorithmic error comprises:
selecting the values of the coarse pitch, the first fine pitch, and the second fine pitch to limit the algorithmic error to limit the high mode evanescent wave enhancement by limiting constructive interference of modes higher than the predetermined cutoff order.

7. The method of claim 1, wherein selecting the values of the coarse pitch, the first fine pitch, and the second fine pitch to limit the algorithmic error comprises:
selecting the values of the coarse pitch, the first fine pitch, and the second fine pitch to limit the algorithmic error such that:

$$\frac{P_2}{P_1} \leq \frac{\lambda/([NA_{ill} + NA_{col}] \cdot P_1)}{1 + \lambda/([NA_{ill} + NA_{col}] \cdot P_1)},$$

where $P_1$ is the first fine pitch, $P_2$ is the second fine pitch, $\lambda$ is a light wavelength, $NA_{ill}$ is an illumination numerical aperture at an illumination, and $NA_{col}$ is a collection numerical aperture at a collection.

8. The method of claim 1, further comprising:
generating pixel maps which approximate oscillation frequencies of diffraction modes having orders higher than the predetermined cutoff order.

9. The method of claim 8, wherein correcting for the algorithmic error associated with oscillation frequencies of the overlay signal higher than a predetermined cutoff order comprises:
correcting for the algorithmic error using the generated pixel maps.

10. The method of claim 8, further comprising:
adjusting normalization coefficients for specified targets using the generated pixel maps.

11. The method of claim 1, wherein correcting for the algorithmic inaccuracy associated with oscillation frequencies of the overlay signal higher than a predetermined cutoff order comprises:
measuring a normalization factor for the two or more cells of the SCOL target; and
generating normalization coefficients for the two or more cells based on the value of the overlay offset and the measured normalization factor.

12. The method of claim 11, wherein updating the overlay offset comprises:
updating the overlay offset based on the generated normalization coefficients.

13. The method of claim 11, wherein the normalization factor includes a pixel average of a pupil image.

14. The method of claim 1, wherein selecting the values of the coarse pitch, the first fine pitch, and the second fine pitch to limit the algorithmic error comprises:
selecting the values of the coarse pitch, the first fine pitch, and the second fine pitch to limit the algorithmic error to limit the algorithmic error by providing that amplitudes of diffraction modes having an order higher than the predetermined cutoff order are lower than a specified percentage of an amplitude of at least one diffraction mode having an order lower than the predetermined cutoff order.

15. The method of claim 14, wherein the specified percentage comprises:
at most one of 10%, 5%, 1%, 0.5%, or 0.1%.

16. A scatterometry overlay (SCOL) target, comprising:
two or more cells on a sample comprising:
at least one first segmented target structure on a first layer of the sample segmented with a coarse pitch and a first fine pitch; and
at least one second segmented target structure on a second layer of the sample segmented with the coarse pitch and a second fine pitch, wherein the two or more cells include two or more predetermined offsets between the corresponding at least one first segmented target structure and the at least one second segmented target structure, wherein an overlay signal associated with measured diffraction modes from the two or more cells is indicative of an overlay offset between the first layer and the second layer of the sample, wherein the overlay signal is a periodic function of the overlay offset and is represented by a sum of oscillation frequencies of different orders, wherein the values of the coarse pitch, the first fine pitch, and the second fine pitch are selected to limit, within a specified inaccuracy requirement, an algorithmic error in determining the overlay offset by limiting oscillation frequencies of the overlay signal having an order higher than a predetermined cutoff order.

17. The SCOL target of claim 16, wherein the predetermined cutoff order is one or two.

18. The SCOL target of claim 16, wherein the values of the coarse pitch, the first fine pitch, and the second fine pitch are selected to limit the algorithmic error by limiting high mode evanescent wave enhancement between the first layer of the sample and the second layer of the sample.

19. The SCOL target of claim 18, wherein the values of the coarse pitch, the first fine pitch, and the second fine pitch are selected to limit the high mode evanescent wave enhancement between the target layers by limiting constructive interference of diffraction modes having orders higher than the predetermined cutoff order.

20. The SCOL target of claim 18, wherein the values of the coarse pitch, the first fine pitch, and the second fine pitch are selected to satisfy $$\frac{P_{coarse}}{P_{fine,1}} \times l_1 \cong \frac{P_{coarse}}{P_{fine,2}} \times l_2$$

where $P_{Coarse}$ is the coarse pitch, $P_1$ is the first fine pitch, $P_2$ is the second fine pitch, $l_1$ is a first integer, and $l_2$ is a second integer.

21. The SCOL target of claim 20, wherein a ratio of the first fine pitch and the second fine pitch is different from any of 1, 2, 3, 1/2, 1/3, 2/3, or 3/2.

22. The SCOL target of claim 16, wherein the values of the coarse pitch, the first fine pitch, and the second fine pitch are selected such that:

$$\frac{P_2}{P_1} \le \frac{\lambda/([NA_{ill} + NA_{col}] \cdot P_1)}{1 + \lambda/([NA_{ill} + NA_{col}] \cdot P_1)},$$

where $P_1$ is the first fine pitch, $P_2$ is the second fine pitch, $\lambda$ is a light wavelength, $NA_{ill}$ is an illumination numerical aperture, and $NA_{col}$ is a collection numerical aperture.

23. The SCOL target of claim 16, wherein the values of the coarse pitch, the first fine pitch, and the second fine pitch are selected to limit the algorithmic error by providing that amplitudes of diffraction modes having an order higher than the predetermined cutoff order are lower than a specified percentage of an amplitude of at least one diffraction mode having an order lower than the predetermined cutoff order.

24. The SCOL target of claim 23, wherein the specified percentage comprises:
at most one of 10%, 5%, 1%, 0.5%, or 0.1%.

25. A method of reducing algorithmic inaccuracy in scatterometry overlay metrology, comprising the steps of:
designing a scatterometry overlay target on a sample, the scatterometry overlay target comprising:
at least one first segmented target structure on a first layer of the sample segmented with a coarse pitch and a first fine pitch; and
at least one second segmented target structure on a second layer of the sample segmented with the coarse pitch and a second fine pitch, wherein the two or more cells include two or more predetermined offsets between the corresponding at least one first segmented target structure and the at least one second segmented target structure, wherein an overlay signal associated with measured diffraction modes from the two or more cells is indicative of an overlay offset between the first layer and the second layer of the sample, wherein the overlay signal is a periodic function of the overlay offset and is represented by a sum of oscillatory frequencies of different orders; and
selecting the values of the coarse pitch, the first fine pitch, and the second fine pitch to limit, within a specified inaccuracy requirement, an algorithmic error in determining the overlay offset by limiting oscillation frequencies having an order higher than a predetermined cutoff order;
providing the designed scatterometry overly target on the sample;
measuring the overlay signal from the scatterometry overlay target on the sample using a detector to determine an overlay offset between the first sample layer and the second sample layer with the limited algorithmic error; and
generating correction terms to correct for the algorithmic error associated with oscillation frequencies of the overlay signal for one or more additional scatterometry overlay targets.

* * * * *